United States Patent
Altunkilic et al.

(10) Patent No.: US 10,438,905 B2
(45) Date of Patent: Oct. 8, 2019

(54) SEAL RING INDUCTOR AND METHOD OF FORMING THE SAME

(71) Applicant: Skyworks Solutions, Inc., Woburn, MA (US)

(72) Inventors: Fikret Altunkilic, North Andover, MA (US); Haki Cebi, Jamaica Plain, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 558 days.

(21) Appl. No.: 15/256,438

(22) Filed: Sep. 2, 2016

(65) Prior Publication Data

US 2016/0372427 A1  Dec. 22, 2016

Related U.S. Application Data

(62) Division of application No. 13/040,096, filed on Mar. 3, 2011, now Pat. No. 9,460,840.

(51) Int. Cl.

| | | |
|---|---|---|
| *H01L 21/00* | (2006.01) | |
| *H01L 23/64* | (2006.01) | |
| *H01F 17/00* | (2006.01) | |
| *H03H 1/00* | (2006.01) | |
| *H01F 41/04* | (2006.01) | |
| *H01L 23/00* | (2006.01) | |
| *H01L 23/58* | (2006.01) | |
| *H01L 23/60* | (2006.01) | |
| *H01L 23/66* | (2006.01) | |
| *H01L 49/02* | (2006.01) | |
| *H05K 1/18* | (2006.01) | |
| *H05K 3/32* | (2006.01) | |

(52) U.S. Cl.
CPC ....... *H01L 23/645* (2013.01); *H01F 17/0013* (2013.01); *H01F 41/041* (2013.01); *H01L 23/562* (2013.01); *H01L 23/564* (2013.01); *H01L 23/585* (2013.01); *H01L 23/60* (2013.01); *H01L 23/66* (2013.01); *H01L 28/60* (2013.01); *H03H 1/0007* (2013.01); *H05K 1/18* (2013.01); *H05K 3/32* (2013.01); *H01F 2017/0046* (2013.01); *H01L 2223/665* (2013.01); *H01L 2223/6677* (2013.01); *H05K 2201/10015* (2013.01); *H05K 2201/1053* (2013.01); *Y10T 29/4902* (2015.01)

(58) Field of Classification Search
CPC ... H01L 23/645; H01L 23/562; H01L 23/564; H01L 23/585; H01L 23/60; H01L 23/66; H01L 28/60
See application file for complete search history.

(56) References Cited

U.S. PATENT DOCUMENTS 6,169,339 B1   1/2001  Cripe
7,898,056 B1 *  3/2011  Keramat ............... H01L 23/564
                                                257/170

(Continued)

*Primary Examiner* — Richard A Booth
(74) *Attorney, Agent, or Firm* — Knobbe Martens Olson & Bear LLP

(57) ABSTRACT

Apparatuses and methods for providing inductance are disclosed. In one embodiment, a method for providing an inductor includes forming an electrical circuit on a substrate, forming a seal ring around the perimeter of the electrical circuit, providing a break in at least one layer of the seal ring, and electrically connecting the seal ring such that the seal ring operates as an inductor.

20 Claims, 9 Drawing Sheets

(56) References Cited

U.S. PATENT DOCUMENTS

| | | |
|---|---|---|
| 7,907,924 B2 | 3/2011 | Kawasaki |
| 8,644,773 B2 | 2/2014 | Cebi |
| 9,460,840 B2 | 10/2016 | Altunkilic et al. |
| 2004/0150070 A1 | 8/2004 | Okada et al. |
| 2004/0227502 A1 | 11/2004 | Wyse et al. |
| 2006/0214798 A1 | 9/2006 | Wang |
| 2008/0129623 A1* | 6/2008 | Barry .................. H01Q 1/2283 343/741 |
| 2009/0134500 A1 | 5/2009 | Kuo |
| 2009/0284339 A1 | 11/2009 | Choi et al. |
| 2010/0026368 A1 | 2/2010 | Tang et al. |
| 2010/0026601 A1 | 2/2010 | Chang et al. |
| 2010/0033290 A1 | 2/2010 | Liu et al. |
| 2010/0182118 A1 | 7/2010 | Roskos et al. |
| 2011/0080153 A1 | 4/2011 | Metzger et al. |
| 2011/0108945 A1 | 5/2011 | Wang et al. |
| 2011/0221560 A1 | 9/2011 | Chen et al. |

* cited by examiner

SEAL RING INDUCTOR AND METHOD OF FORMING THE SAME

CROSS-REFERENCE TO RELATED APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to electronics, and in particular, to inductors.

Description of the Related Technology

Radio frequency (RF) electronic systems such as receivers, transmitters and/or receivers can use an inductor for a variety of purposes. For example, a RF electronic system can include an inductor for protecting the RF electronic system from an electrostatic discharge (ESD) event. Additionally, a RF electronic system can use an inductor for other purposes, such as for filtering a RF signal and/or for operating as a choke.

The inclusion of an inductor can increase the area and/or cost of an electronic system. For example, a discrete inductor can be employed on a RF board of an electronic system, but the discrete inductor can increase board area and/or component count. Alternatively, an inductor can be fabricated on an integrated circuit. However, an inductor fabricated on an integrated circuit can significantly increase chip area and/or cost.

There is a need for improved apparatus and methods for providing inductance.

SUMMARY

In certain embodiments, the present disclosure relates to an apparatus including a substrate, an electrical circuit disposed on the substrate, and a seal ring disposed on the substrate and surrounding the perimeter of the electrical circuit. The seal ring is configured to operate as an inductor and includes a first conductive layer configured to operate as a first coil of the inductor and having a first break defining a first end and a second end of the first coil.

In some embodiments, the seal ring further includes a second conductive layer adjacent the first conductive layer, the second conductive layer including a second break. In certain embodiments, the first break and the second break at least partially overlap when the first and second conductive layers are viewed from above the substrate.

According to a number of embodiments, the second conductive layer is configured to operate as a second coil of the inductor, the second break defining a first end and a second end of the second coil. In various embodiments, the apparatus further includes a via for electrically connecting the second end of the first coil to the first end of the second coil.

According to some embodiments, the substrate is a gallium arsenide (GaAs) substrate.

In various embodiments, the inductor is configured to operate as a choke, the inductor including a first end electrically connected to a bias circuit and a second end electrically connected to a radio frequency circuit.

In a number of embodiments, the apparatus further includes a bonding pad disposed above the substrate and a pad protection circuit, the pad protection circuit including a first capacitor having a first end electrically connected to the bonding pad and a second end electrically connected to a first end of the inductor.

In accordance with certain embodiments, the inductor includes a second end electrically connected to a ground supply.

In various embodiments, the first end of the inductor and the second end of the capacitor are electrically connected to an antenna.

According to several embodiments, the first capacitor is disposed on the substrate and surrounded by the seal ring.

In some embodiments, the apparatus further includes a radio frequency filter and a first radio frequency circuit, the radio frequency filter including a first capacitor having a first end electrically connected to the first radio frequency circuit and a second end electrically connected to a first end of the inductor. In accordance with various embodiments, the apparatus includes a second capacitor having a first end electrically connected to the second end of the capacitor and to the first end of the inductor. In some embodiments, the apparatus further includes a second radio frequency circuit electrically connected to the second end of first capacitor and to the first end of the first inductor.

In certain embodiments, the present disclosure relates to a method of providing an inductor. The method includes forming an electrical circuit on a substrate, forming a seal ring around the perimeter of the electrical circuit, providing a break in at least one layer of the seal ring, and electrically connecting the seal ring such that the seal ring operates as an inductor.

In some embodiments, providing a break in at least one layer of the seal ring includes providing a break in a conductive layer of the seal ring to form a coil of the inductor.

In certain embodiments, the method further includes providing a bonding pad above the substrate and electrically connecting the inductor so as to provide electrostatic discharge (ESD) protection to a circuit associated with the bonding pad. In various embodiments, electrically connecting the inductor so as to provide ESD protection to the circuit associated with the bonding pad includes providing a first capacitor having a first end electrically connected to the bonding pad and a second end electrically connected to a first end of the inductor.

In various embodiments, the method further includes electrically connecting the first end of the inductor to an antenna.

According to a number of embodiments, the method further includes electrically connecting a second of the inductor to a ground supply.

In certain embodiments, the method further includes electrically connecting the inductor such that the inductor operates as a radio frequency filter.

In accordance with some embodiments, the method further includes electrically connecting the inductor such that the inductor operates as a choke.

In certain embodiments, the present disclosure relates to an apparatus includes a substrate means, an electronic circuit means disposed on the substrate means, and a seal ring means disposed on the substrate means and surrounding the electronic circuit means. The seal ring means is configured to operate as an inductor and includes a first conductive layer configured to operate as a first coil of the inductor. The first conductive layer includes a first break defining a first end and a second end of the first coil.

In some embodiments, the seal ring further includes a second conductive layer adjacent the first conductive layer, the second conductive layer having a second break. In various embodiments, the second conductive layer is configured to operate as a second coil of the inductor, the second break defining a first end and a second end of the second coil. According to a number of embodiments, the apparatus further includes a via for electrically connecting the second end of the first coil to the first end of the second coil.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF EMBODIMENTS

The headings provided herein, if any, are for convenience only and do not necessarily affect the scope or meaning of the claimed invention.

Overview of Seal Ring Inductors

Figure 1A:
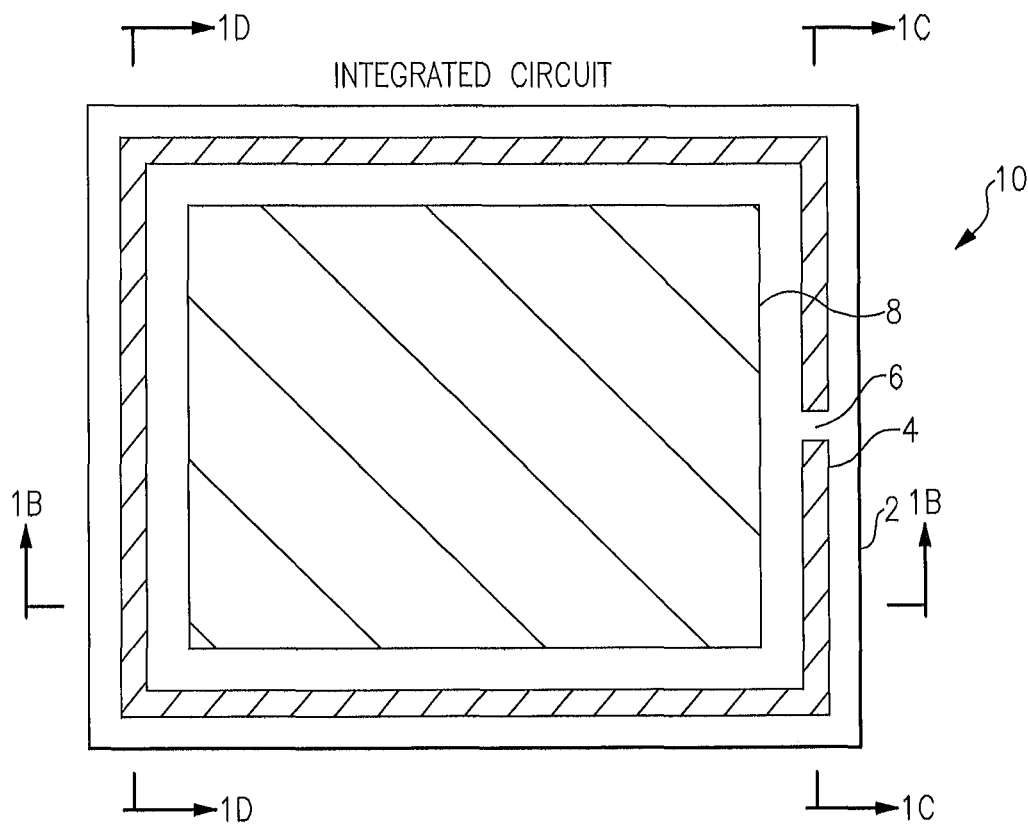
FIG. 1A is a plan view of a radio frequency (RF) integrated circuit (IC) according to one embodiment.

FIG. 1A is a plan view of a radio frequency (RF) integrated circuit (IC) 10 according to one embodiment. The RF IC 10 includes a substrate 2, a seal ring 4, and circuit area 8.

The seal ring 4 can surround the perimeter of the circuit area 8 of the IC 10. The seal ring can be used for a variety of purposes, such as to prevent moisture from reaching the circuit area 8 and/or to aid in reducing the formation of cracks in the IC 10. For example, the IC 10 can be fabricated on a wafer, and the seal ring 4 can aid in preventing the formation of cracks in the IC 10 when the wafer is scribed and/or diced to form a plurality of ICs.

The seal ring 4 can include a plurality of conductive, contact and/or via layers, as will be described below. A break 6 can be included in one or more conductive layers of the seal ring 4. The break 6 permits the seal ring 4 to be employed as an inductor in a circuit, as will be described in detail herein.

Although the seal ring 4 is illustrated as having a rectangular shape when viewed from above the substrate, the seal ring 4 can have any suitable shape, including, for example a square, oval or circle.

The substrate 2 can be any suitable substrate. In one embodiment, the substrate is a GaAs substrate. The substrate 2 can include a variety of structures, including, for example, one or more epitaxial layers to aid in fabricating transistors. The substrate 2 can be processed using any suitable process.

The IC 10 can include the circuit area 8. The circuit area 8 can include a wide variety of transistors and/or other electronic structures, including, for example, pseudomorphic high electron mobility (pHEMT) transistors. As will be described in further detail below, the seal ring 4 can be electrically connected to one or more circuit elements in the circuit area 8 and/or to components externally located from the IC 10. For example, the IC 10 can be configured to operate as an inductor and electrically connected to a capacitor fabricated in the circuit area 8 and/or to a capacitor located external to the IC 10.

Figure 1B:
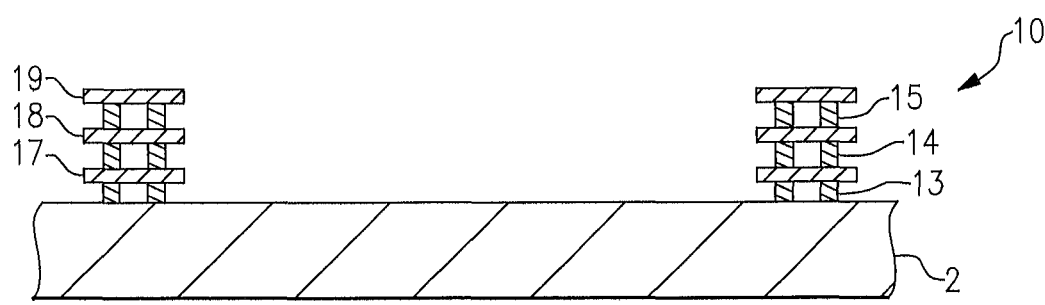
FIG. 1B is a cross-section of the RF IC of FIG. 1A taken along the line 1B-1B.
Figure 1C:
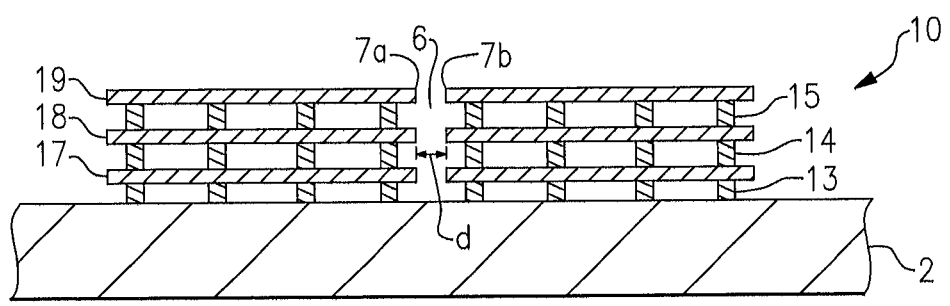
FIG. 1C is a cross-section of the RF IC of FIG. 1A taken along the line 1C-1C.
Figure 1D:
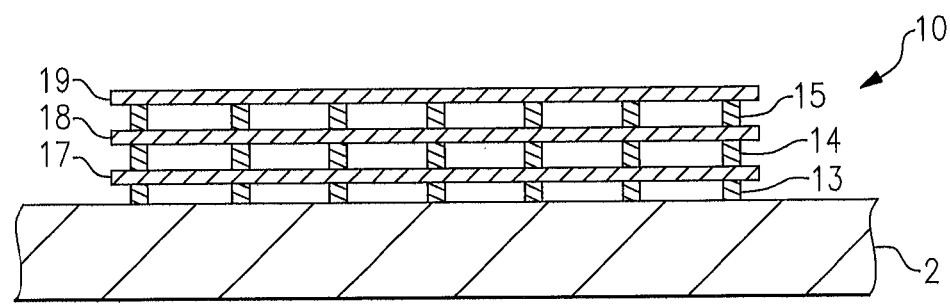
FIG. 1D is a cross-section of the RF IC of FIG. 1A taken along the line 1D-1D.

FIG. 1B is a cross-section of the RF IC of FIG. 1A taken along the line 1B-1B. FIG. 1C is a cross-section of the RF IC of FIG. 1A taken along the line 1C-1C. FIG. 1D is a cross-section of the RF IC of FIG. 1A taken along the line 1D-1D.

As illustrated in the cross-sections shown in FIGS. 1B-1D, the seal ring 4 can include a plurality of conductive, contact and/or via layers. For example, the illustrated seal ring 4 includes a contact layer 13, a first conductive layer 17, a first via layer 14, a second conductive layer 18, a second via layer 15, and a third conductive layer 19. Persons having ordinary skill in the art will appreciate that a seal ring can include more or fewer conductive layers, contact layers and/or via layers. Additionally, the seal ring can include other layers in addition to those illustrated, including, for example, well and/or diffusion layers.

The first, second and third conductive layers 17-19 can be any suitable conductor, including for example, a metal comprising nickel (Ni), aluminum (Al), gold (Au), silver (Ag), tin (Sn), and/or aluminum (Al). The first, second and third layers 17-19 can have varying thicknesses, widths and/or compositions. Likewise, the contact layer 13 and first and second via layers 14, 15 can include a wide variety of materials, and can include a metal such as those describing above with respect to the conductive layers 17-19.

The seal ring 4 includes the break 6. The break 6 permits the seal ring 4 to operate electrically as an inductor. For example, providing the break 6 can result in a formation of a first end 7a and a second end 7b of the seal ring 4, and the first and second ends 7a, 7b can be operated as first and second ends of an inductor. The first end 7a and the second end 7b of the inductor can be spaced by any suitable distance, such as a distance d in the range of about 10 μm to about 20 μm. The distance d can be selected to be the minimum spacing permitted by the processing technology.

By providing the break 6 in the seal ring 4, the seal ring 4 can operate as an inductor in an electrical circuit. Since the seal ring 4 can surround the perimeter of the circuit area 8 of the IC 10, the seal ring 4 can have a relatively large inductive coil and therefore a relatively large inductance. The seal ring 4 can be employed as an inductor in a variety of circuits, and can be used to reduce the area of an electronic system. For example, using the seal ring 4 as an inductor can reduce the area of the IC 10 relative to a design that uses an inductor fabricated in the circuit area 8. Additionally, using the seal ring 4 as an inductor can result in a reduction in area and/or cost of an electronic system relative to a system using a discrete inductor and/or an inductor formed using board trace.

Figure 2A:
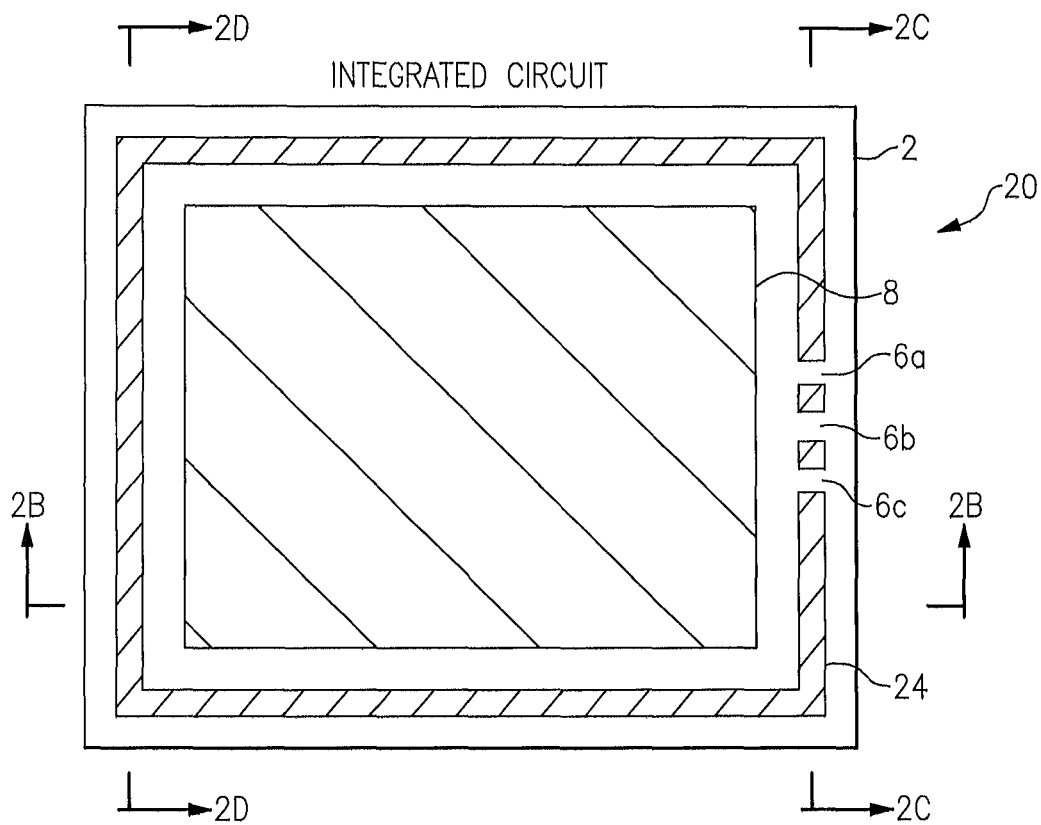
FIG. 2A is a plan view of a RF IC according to another embodiment.
Figure 2B:
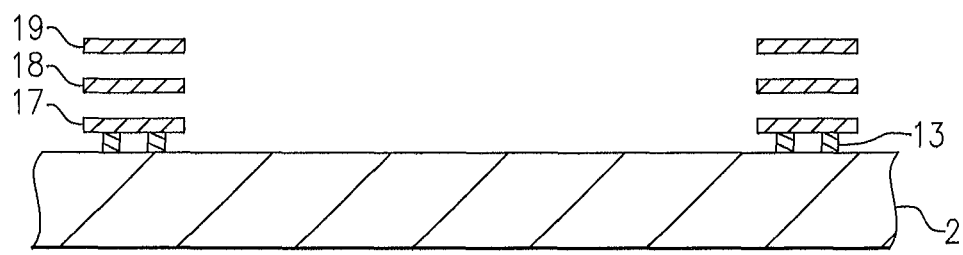
FIG. 2B is a cross-section of the RF IC of FIG. 2A taken along the line 2B-2B.
Figure 2C:
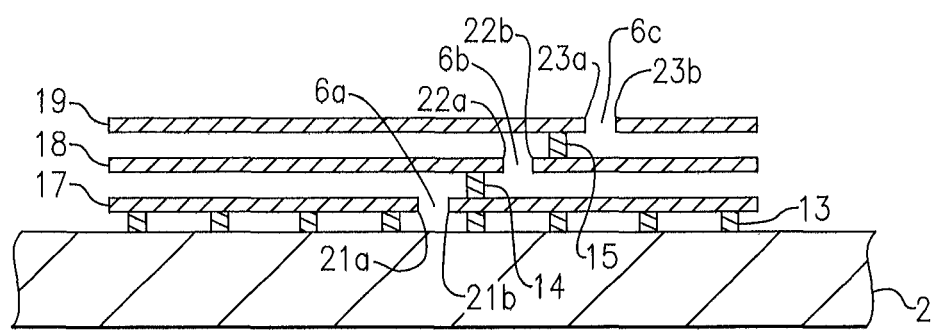
FIG. 2C is a cross-section of the RF IC of FIG. 2A taken along the line 2C-2C.
Figure 2D:
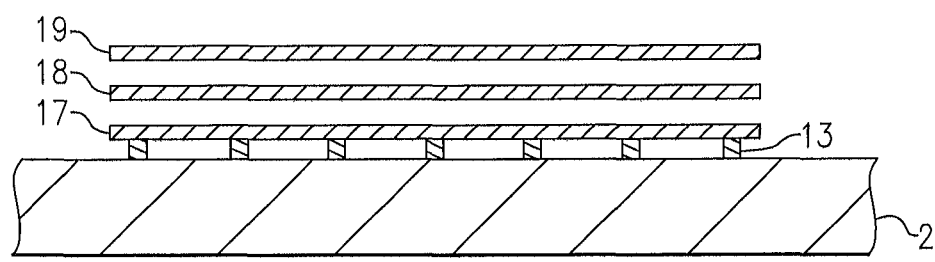
FIG. 2D is a cross-section of the RF IC of FIG. 2A taken along the line 2D-2D.

FIG. 2A is a plan view of a RF IC 20 according to another embodiment. FIG. 2B is a cross-section of the RF IC of FIG. 2A taken along the line 2B-2B. FIG. 2C is a cross-section of the RF IC of FIG. 2A taken along the line 2C-2C. FIG. 2D is a cross-section of the RF IC of FIG. 2A taken along the line 2D-2D.

The RF IC 20 includes a substrate 2, a seal ring 24, and circuit area 8. The RF IC 20 can be similar to the RF IC 10 of FIGS. 1A-1D. However, in contrast to the seal ring 4 of the RF IC 10 of FIGS. 1A-1D, the seal ring 24 of FIGS. 2A-2D is includes a plurality of inductive coils.

For example, as shown in FIG. 2C, the seal ring 24 can include a first break 6a in the first conductive layer 17, a second break 6b in the second conductive layer 18, and a third break 6c in the third conductive layer 19. The first break 6a defines a first end 21a and a second end 21b of the first conductive layer 17, the second break 6b defines a first end 22a and a second end 22b of the second conductive layer 18, and the third break 6c defines a first end 23a and a second end 23b of the third conductive layer 19. By providing the first, second and third breaks 6a-6c, the first, second and third conductive layers 17-19 can be configured to operate as coils of an inductor formed from the seal ring 24. The coils of the inductor can be electrically connected end-to-end using the first and second via layers 14, 15. For example, the first via layer 14 can be used to electrically connect the second end 21b of the first conductive layer 17 to the first end 22a of the second conductive layer 18, and the second via layer 15 can be used to connect the second end 22b of the second conductive layer 18 to the first end 23a of the third conductive layer 19. Thus, the first end 21a of the first conductive layer 17 and the second end 23b of the third conductive layer 19 can operate as first and second ends of an inductor formed from the seal ring 24.

Figure 3A:
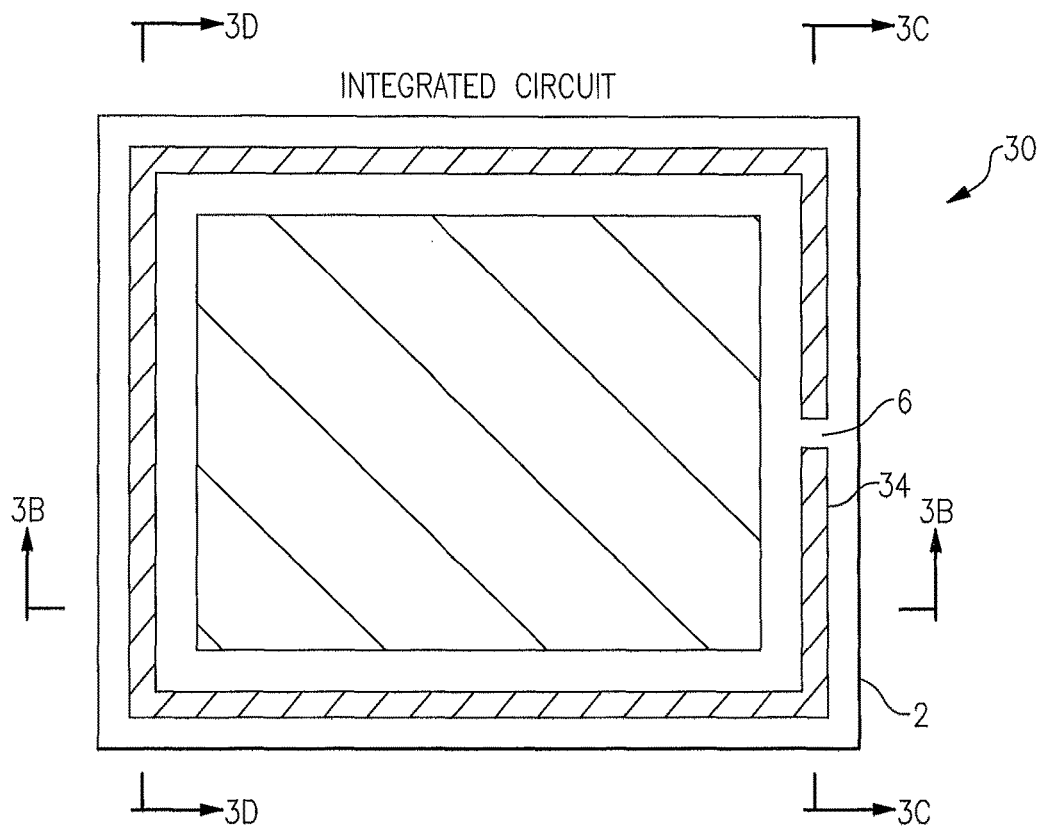
FIG. 3A is a plan view of a RF IC according to yet another embodiment.
Figure 3B:
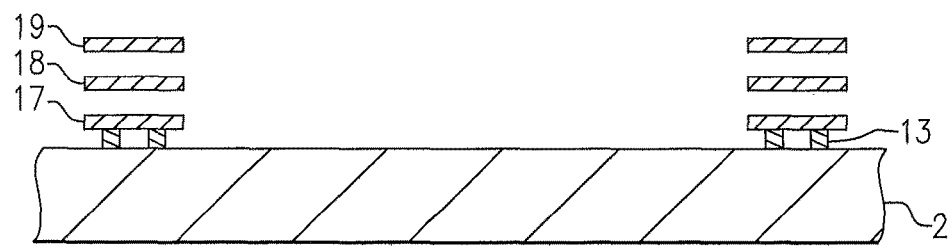
FIG. 3B is a cross-section of the RF IC of FIG. 3A taken along the line 3B-3B.
Figure 3C:
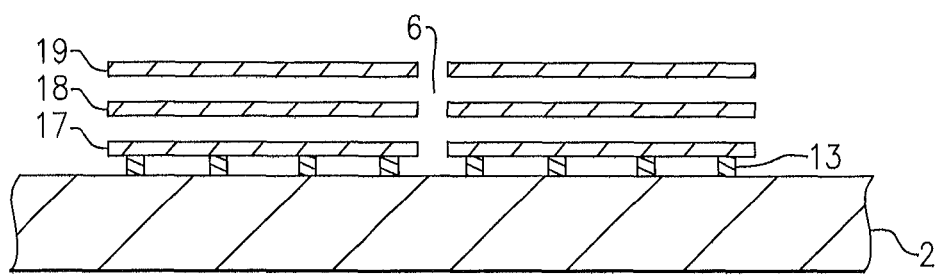
FIG. 3C is a cross-section of the RF IC of FIG. 3A taken along the line 3C-3C.
Figure 3D:
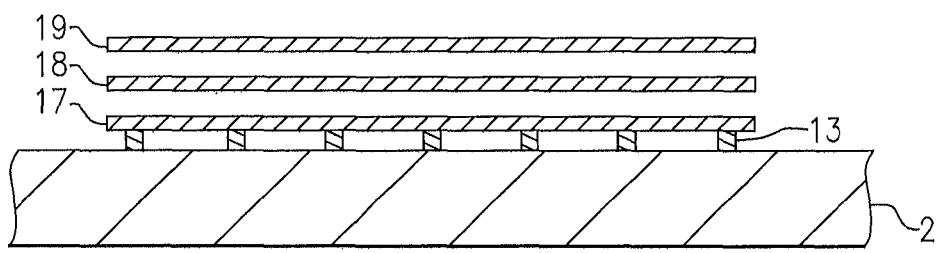
FIG. 3D is a cross-section of the RF IC of FIG. 3A taken along the line 3D-3D.

FIG. 3A is a plan view of a RF IC 30 according to another embodiment. FIG. 3B is a cross-section of the RF IC 30 of FIG. 3A taken along the line 3B-3B. FIG. 3C is a cross-section of the RF IC 30 of FIG. 3A taken along the line 3C-3C. FIG. 3D is a cross-section of the RF IC 30 of FIG. 3A taken along the line 3D-3D.

The RF IC 30 of FIGS. 3A-3D can be similar to the RF IC 10 of FIGS. 1A-1D, and can include a break 6 in the first, second and third conductive layers 17-19. However, in contrast to the RF IC 10 of FIGS. 1A-1D, the first, second and third conductive layers 17-19 of the RF IC 30 of FIGS. 3A-3D are not interconnected in the seal ring 34 by the first and second vias 14, 15. Rather, the vias have not been included in favor of using the first, second, and third conductive layers as separate inductive coils of the inductor. The coils of the inductor can be electrically connected using vias in the circuit region 8 and/or by using connections external to the RF IC 30. The inductive coils can be electrically connected end-to-end to form an inductor, or used as coils in different inductors.

Figure 4:
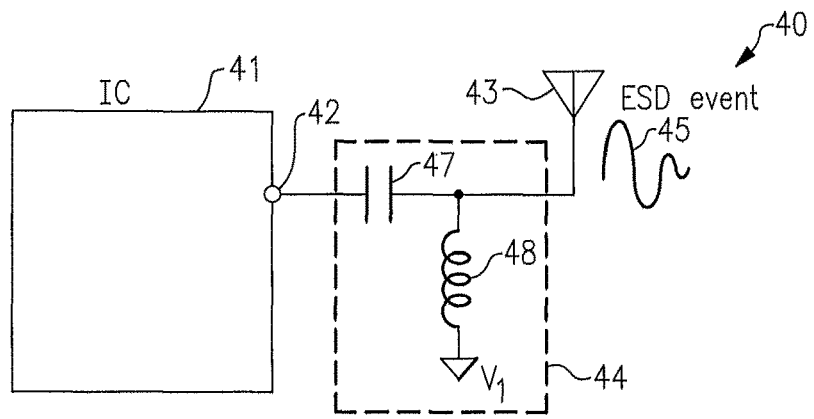
FIG. 4 is a schematic block diagram of an electronic system according to one embodiment.

FIG. 4 is an electronic system 40 according to one embodiment. The electronic system 40 includes an IC 41, an antenna 43, and an electrostatic discharge (ESD) protection circuit 44. The IC 41 can include a plurality of pins or pads, including the pad 42. The pad 42 can be configured to communicate with the antenna 43.

The antenna 43 can be exposed to an ESD event, such as the ESD event 45. The ESD protection circuit 44 can be electrically connected to the pad 42 in order to protect the IC 41 from damage from the ESD event 45. For example, the ESD event can generate high voltage conditions, increase power dissipation and heating, and/or induce latch-up when an ESD protection circuit is not included to protect the IC 41.

The protection circuit 41 includes a capacitor 47 and an inductor 48. The capacitor 47 includes a first end electrically connected to the pad 42, and a second end electrically connected to a first end of the inductor 48 and to the antenna 43. The inductor 48 further includes a second end electrically connected to the voltage reference $V_1$, which can be, for example, a ground node or a power supply.

During normal operation of the RF IC 41, the RF IC 41 can generate or receive RF signals using the pad 42 that have a frequency greater than the frequency of signals associated with the ESD event 45. Thus, the protection circuit 44 can include the capacitor 47 for passing high frequency RF signals associated with typical operation of the RF IC 41. During an ESD event, the capacitor 47 can aid in providing ESD protection by blocking a portion of the ESD event from reaching the RF IC 41. Additionally, the inductor 48 of the protection circuit 44 can shunt a portion of the charge associated with an ESD event 45 to the voltage reference $V_1$ before it reaches the IC 41, thereby providing ESD protection.

The RF IC 41 can include additional pins or pads that can be electrically connected to other portions of the electronic system 40. The additional pins or pads can have one or more ESD protection circuits, such as the ESD protection circuit 44 of FIG. 4. The additional pins or pad need not be electrically connected to an antenna.

The inductor 48 can be formed using a seal ring of the IC 41. For example, any of the seal rings illustrated in FIGS. 1A-3D can be used to form the inductor 48 of the ESD protection circuit 44. By using a seal ring of the IC 41 to function as an inductor, the area and/or cost of the electronic system can be reduced.

The capacitor 47 of the protection circuit 44 can be fabricated on the IC 41. For example, the capacitor 47 can be formed in the device area of the IC 41, in a manner similar to that illustrated by the device area 8 shown in FIGS. 1A, 2A and 3A. Thus, the protection circuit 45 can be fabricated entirely on the IC 41. However, all or a portion of the capacitor 47 can be provided using components formed outside the IC 41, including, for example, by using a discrete component, such as a surface mount component, to provide the desired capacitance. Thus, a portion of the protection circuit 44 can be external to the IC 41.

Figure 5:
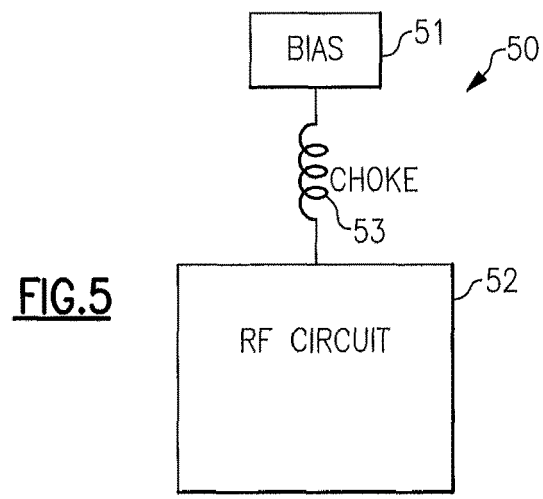
FIG. 5 is a schematic block diagram of an electronic system according to another embodiment.

FIG. 5 is a schematic block diagram of an electronic system 50 according to another embodiment. The electronic system 50 includes a bias circuit 51, a RF circuit 52 and a choke 53. The choke 53 includes a first end electrically connected to the bias circuit 51 and a second end electrically connected to the RF circuit 52.

The bias circuit 51 can be used to generate a reference current and/or voltage for the RF circuit 52. The choke 53 can be used to aid in preventing high-frequency components of the RF circuit 52 from reaching the bias circuit 51, thereby enhancing the performance of the bias circuit 51.

The choke 53 can be provided by using a seal ring of an IC. For example, the choke 53 can be formed using the seal rings illustrated in FIGS. 1A-3D. The IC used to form the choke 53 can be the same, or a different IC as the IC of the RF circuit 52. For example, the bias circuit 51, the RF circuit 52 and the choke 53 can be provided on a single IC, and the choke 53 can be formed from a seal ring of the IC. Alternatively, the bias circuit 51 can be provided on a first IC, the RF circuit 52 can be provided on a second IC, and the choke 53 can be provided using the seal ring of the first and/or second ICs.

Figure 6:
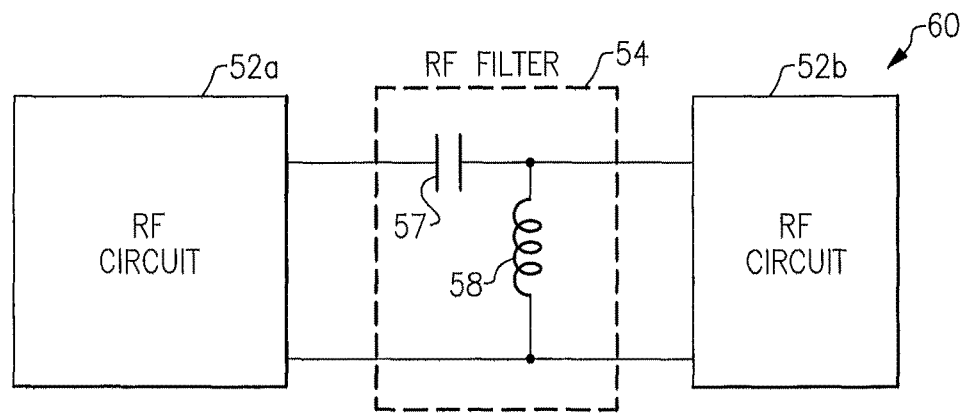
FIG. 6 is a schematic block diagram of an electronic system according to yet another embodiment.

FIG. 6 is a schematic block diagram of an electronic system 60 according to yet another embodiment. The electronic system 60 includes a first RF circuit 52a, a second RF circuit 52b, and a RF filter 54. The RF filter 54 includes a capacitor 57 and an inductor 58.

The capacitor 57 includes a first end electrically connected to the first RF circuit 52a, and a second end electrically connected to the second RF circuit 52b and to a first end of the inductor 57. The inductor 58 further includes a second end electrically connected to the first and second RF circuits 52a, 52b. For example, the second end of the inductor 58 can be electrically connected to a ground node or any other suitable node of the first and second RF circuits 52a, 52b.

The RF filter 54 can aid in filtering signals provided from the first RF circuit 52a to the second RF circuit 52b and/or from the second RF circuit 52b to the first RF circuit 52a. For example, the RF filter 54 can be used as a high-pass filter for signals exchanged between the first and second RF circuits 52a, 52b.

The inductor 58 can be provided by using a seal ring of an IC. For example, the choke 53 can be formed using the seal rings illustrated in FIGS. 1A-3D. The first and second RF circuits 52a, 52b can be on a single IC, and the inductor 58 can be formed from the seal ring of the IC. For implementations in which the first and second RF circuits 52a, 52b are disposed on separate ICs, the seal ring used to form the inductor 58 can be on either or both of the ICs. The capacitor 57 can be a discrete component, can be integrated onto one or more ICs, and/or can include both integrated and discrete components.

The RF filter 54 illustrates one example of a filtering circuit using an inductor. Persons having ordinary skill in the art will appreciate that a wide variety of other filter circuits including an inductor can be used in accordance with the seal ring inductors described herein.

Figure 7A:
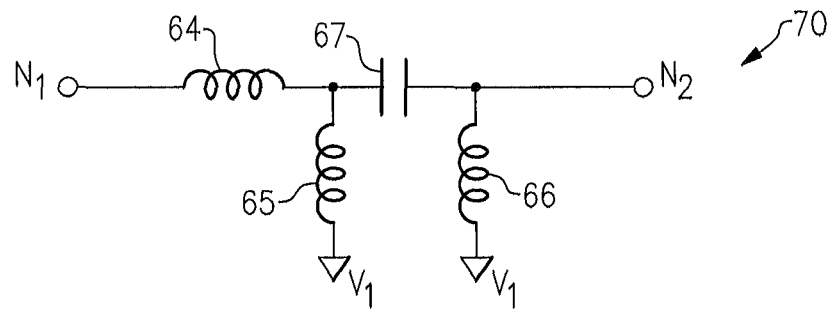
FIG. 7A is a circuit diagram of a circuit in accordance with one embodiment.

FIG. 7A is a circuit diagram of a circuit 70 in accordance with one embodiment. The circuit 70 includes a first inductor 64, a second inductor 65, a third inductor 66, and a capacitor 67.

The first inductor 64 includes a first end electrically connected to a node $N_1$, and a second end electrically connected to a first end of the second inductor 65 and to a first end of the capacitor 67. The second inductor 65 further includes a second end electrically connected to the reference voltage $V_1$. The capacitor 67 further includes a second end electrically connected to a first end of the third inductor 66 and to the second node $N_2$. The second inductor 66 further includes a second end electrically connected to the reference voltage $V_1$.

The first, second and/or third inductors 64-66 can be fabricated using a seal ring of an IC, such as the seal rings illustrated in FIGS. 1A-3D. For example, the first, second and third conductive layers of FIGS. 3A-3D can operate as the first, second and third inductors 64-66, respectively. The first, second and third inductors can also be provided using a combination of IC seal rings and/or discrete components, including, for example, inductors formed from board trace. The capacitor 67 can be a capacitor formed on an IC, or can be a discrete component, such as a surface mount device disposed on a RF circuit board.

The circuit 70 of FIG. 7A can be used in a wide variety of electronic systems. For example, the node $N_1$ can be electrically connected to a pin or pad of an IC and the node $N_2$ can be electrically connected to an antenna or other part of an electronic system to provide ESD protection. The circuit 70 can also be used in other applications, including, for example, as a RF filter. For example, the node $N_1$ can be electrically connected to a first RF circuit and the node $N_2$ can be electrically connected to a second RF circuit, and the circuit 70 can be used to filter signals communicated between the first and second RF circuits. Persons of ordinary skill in the art will appreciate that the circuit 70 of FIG. 7A can be used in additional applications.

Figure 7B:
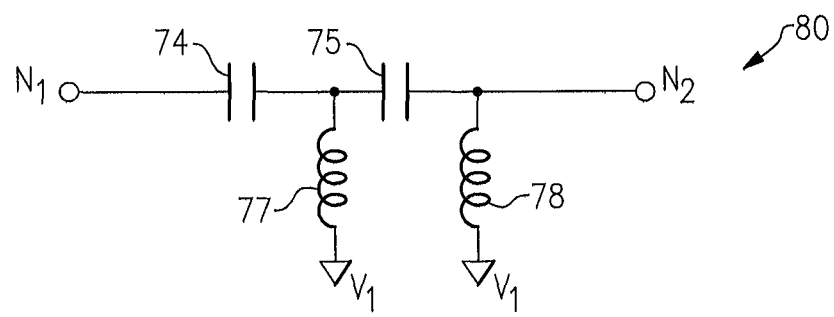
FIG. 7B is a circuit diagram of a circuit in accordance with another embodiment.

FIG. 7B is a circuit diagram of a circuit 80 in accordance with another embodiment. The circuit 80 includes a first inductor 77, a second inductor 78, a first capacitor 74, and a second capacitor 75.

The first capacitor 74 includes a first end electrically connected to a node $N_1$, and a second end electrically connected to a first end of the first inductor 77 and to a first end of the second capacitor 75. The first inductor 77 further includes a second end electrically connected to the reference voltage $V_1$. The second capacitor 75 further includes a second end electrically connected to a first end of the second inductor 78 and to the second node $N_2$. The second inductor 78 further includes a second end electrically connected to the reference voltage $V_1$.

The first and/or second inductors 77, 78 can be fabricated using a seal ring of an IC, including, for example, the seal rings illustrated in FIGS. 1A-3D. The first and second inductors can also be provided using a combination of one or more IC seal rings and discrete components, including, for example, inductors formed from board trace and/or provided as surface mount components. The first and second capacitors 74, 75 can be provided using any suitable combination of integrated and/or discrete components.

The circuit 80 of FIG. 7B can be used in a wide variety of configurations in an electronic system. For example, the circuit 80 can be used as an ESD protection circuit for a RF IC, as a RF filter in an electronic system, and/or in any other suitable application.

Figure 7C:
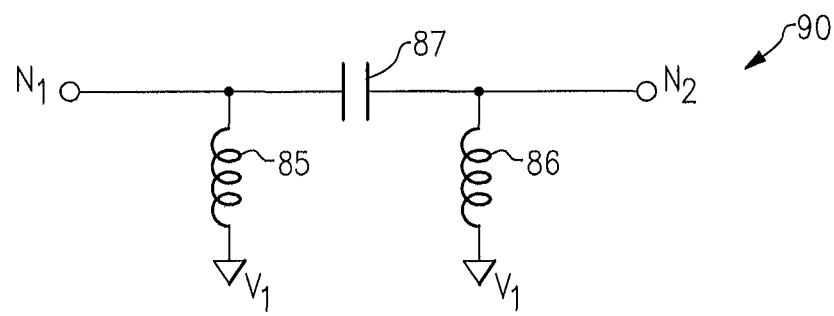
FIG. 7C is a circuit diagram of a circuit in accordance with yet another embodiment.

FIG. 7C is a circuit diagram of a circuit 90 in accordance with yet another embodiment. The circuit 90 includes a first inductor 85, a second inductor 86, and a capacitor 87.

The capacitor 87 includes a first end electrically connected to a node $N_1$ and to a first end of the first inductor 85, and a second end electrically connected to the second node $N_2$ and to a first end of the second inductor 86. The first inductor 85 further includes a second end electrically connected to the reference voltage $V_1$. The second inductor 86 further includes a second end electrically connected to the reference voltage $V_1$.

The first and/or second inductors 85, 86 can be fabricated using a seal ring of an IC, as was described earlier. The first and second inductors can also be provided using one or more IC seal rings in combination with other elements, including, for example, discrete or integrated inductive components. The capacitor 87 can be provided in any suitable manner, as was described earlier.

The circuit 90 of FIG. 7C can be used in a wide variety of configurations in an electronic system. For example, circuit 90 can be employed as an ESD protection circuit, as a RF filter in an electronic system, and/or in any other suitable application.

Figure 8:
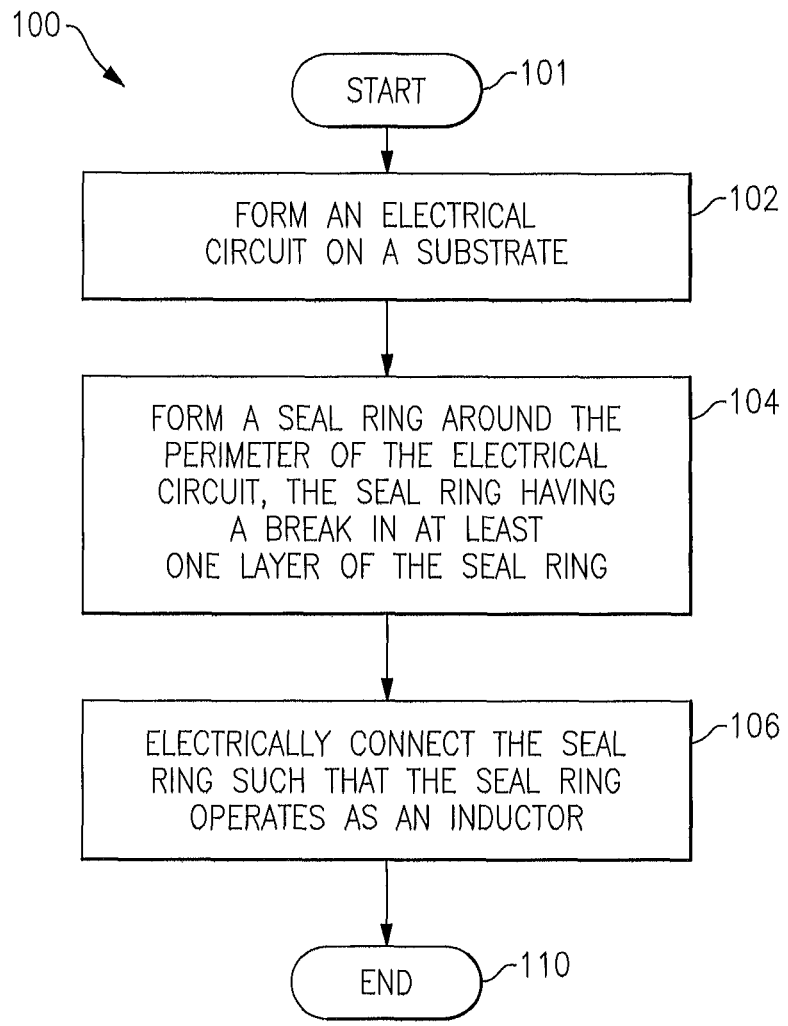
FIG. 8 illustrates a method for providing an inductor in accordance with one embodiment.

FIG. 8 illustrates a method 100 for providing an inductor in accordance with one embodiment. It will be understood that the methods discussed herein may include greater or fewer operations and the operations may be performed in any order, as necessary. The illustrated method can be used to provide, for example, the inductive seal ring structures of FIGS. 1A-3D.

The method 100 for providing an inductor starts at 101. In an ensuing block 102, an electrical circuit is formed on a substrate. The electrical circuit can be formed in a circuit area of the substrate, as was described above with reference to FIG. 1A. The electrical circuit can include transistors, capacitors, resistors, inductors, and/or any other suitable component, and can provide RF functionality. For example, the electrical circuit can be configured to generate signals for use by an antenna.

The method 100 continues at a block 104, in which a seal ring is formed around the perimeter of the electrical circuit. The seal ring includes a break in at least one layer of the seal ring. When viewed from above, the seal ring can have any suitable shape, including, for example a square, rectangle, oval or circle that surrounds the perimeter of the electrical circuit formed in block 102. The seal ring can prevent moisture from reaching the electrical circuit and/or can prevent the formation of cracks in the substrate, which can propagate into the portion of the substrate used to form the electrical circuit, thereby rendering the electrical circuit inoperable.

In an ensuing block 106, the seal ring is electrically connected to operate as an inductor. For example, the break in the seal ring formed in block 104 can result in the seal ring having a first end and a second end that can be operated as first and second ends of an inductor. Thus, the first end of the seal ring can be electrically connected to a first node of an electronic system, and the second end of the seal ring can be electrically connected to a second node of the electronic system, and the seal ring can operate as an inductor in the electronic system. In certain implementations, the seal ring operates as an inductor in the electrical circuit formed in block 102. However, in other implementations, the seal ring operates as an inductor in a circuit that is at least partially external to the substrate the seal ring is disposed on. Since the seal ring surrounds the perimeter of the electrical circuit formed in block 102, the seal ring can be relatively large and can have a relatively large inductance. The seal ring can be electrically connected and configured to operate as an inductor in a wide variety of electrical systems, including RF filter systems, ESD protection systems, and/or biasing systems.

Applications

The seal ring inductors described herein can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of providing a seal ring, comprising:
    forming an electrical circuit on a substrate, the electrical circuit including a first capacitor configured to receive a radio frequency (RF) signal generated by the electrical circuit;
    forming a seal ring around a perimeter of the electrical circuit;
    providing a first break in a first coil in a first conductive layer of the seal ring, the first break defining a first end and a second end of the first coil, the first end of the first coil including a first end of the seal ring;
    electrically connecting the first capacitor to an antenna external to the electrical circuit or a first RF circuit external to the electrical circuit; and
    electrically connecting the first end of the seal ring to the first capacitor and to the antenna or the first RF circuit such that the seal ring is configured to operate as an inductive component.

2. The method of claim 1 further comprising providing a second break in a second conductive layer of the seal ring, the second break defining a first end and a second end of a second coil.

3. The method of claim 2 further comprising electrically connecting the second end of the first coil to the first end of the second coil.

4. The method of claim 2 wherein the first break and the second break at least partially overlap when the first and second conductive layers are viewed from above the substrate.

5. The method of claim 1 wherein the substrate is a gallium arsenide (GaAs) substrate.

6. The method of claim 1 further comprising electrically connecting a second end of the seal ring to a bias circuit of the first RF circuit such that the seal ring is configured to prevent high frequency signal components of the first RF circuit from reaching the bias circuit.

7. The method of claim 6 further comprising electrically connecting the second end of the seal ring to a ground supply.

8. The method of claim 1 further comprising electrically connecting a pin to a first end of the first capacitor.

9. The method of claim 1 further comprising electrically connecting the seal ring to a second RF circuit such that the first capacitor and the seal ring are configured to filter signals from the first RF circuit to the second RF circuit.

10. The method of claim 1 further comprising electrically connecting a second capacitor to the first capacitor and to the first end of the seal ring.

11. The method of claim 1 further comprising electrically connecting a second RF circuit capacitor to the first capacitor and to a second end of the seal ring.

12. The method of claim 1 further electrically connecting a bonding pad to the first capacitor and to the seal ring so as to provide electrostatic discharge (ESD) protection to the electrical circuit.

13. The method of claim 12 wherein electrically connecting the bonding pad to the first capacitor and to the seal ring includes electrically connecting a first end of the first capacitor to the bonding pad and electrically connecting a second end of the first capacitor to the first end of the seal ring.

14. A method of operating a seal ring, comprising:
    providing an integrated circuit (IC) including a substrate, a circuit area disposed on the substrate, and a seal ring disposed on the substrate and surrounding a perimeter of the circuit area, the circuit area including a first capacitor configured to receive a radio frequency (RF) signal generated by the IC and electrically connected to an antenna external to the IC or a first RF circuit external to the IC, the seal ring including a first coil in a first conductive layer, the first coil having a first break defining a first end and a second end of the first coil, the first end of the first coil including a first end of the seal ring, the first end of the seal ring electrically connected to the first capacitor and to the antenna or the first RF circuit; and
    operating the seal ring as an inductive component.

15. The method of claim 14 further comprising filtering signals from the first RF circuit to a second RF circuit electrically connected to the seal ring.

16. The method of claim 14 further comprising preventing high frequency signal components of the first RF circuit from reaching a bias circuit of the first RF circuit electrically connected to a second end of the seal ring.

17. The method of claim 14 further comprising electrically connecting a second RF circuit capacitor to the first capacitor and to a second end of the seal ring.

18. A method of operating a seal ring, comprising:
    providing a semiconductor die comprising a substrate, a circuit area fabricated on the substrate, and a seal ring fabricated on the substrate, the circuit area including a first capacitor configured to receive a radio frequency (RF) signal generated by the circuit area and electrically connected to an antenna external to the semiconductor die or a first RF circuit external to the semiconductor die, the seal ring including a first coil in a first conductive layer, the first coil having a first break defining a first end and a second end of the first coil, the first end of the first coil including a first end of the seal ring, the first end of the seal ring electrically connected to the first capacitor and to the antenna or the first RF circuit; and
    operating the seal ring as an inductive component.

19. The method of claim 18 wherein the first end and the second end of the first coil are separated by a distance in the range of about 10 µm to about 20 µm.

20. The method of claim 18 wherein a distance between the first end and the second end of the first coil is equal to a minimum distance permitted by a processing technology.

\* \* \* \* \*